United States Patent
Haraki et al.

(10) Patent No.: US 8,177,550 B2
(45) Date of Patent: May 15, 2012

(54) VERTICAL HEAT TREATMENT APPARATUS AND METHOD FOR OPERATING THE SAME

(75) Inventors: Kenjiro Haraki, Tokyo-To (JP); Hiroyuki Yamamoto, Tokyo-To (JP); Satoshi Uemura, Tokyo-To (JP); Yuji Tsunoda, Tokyo-To (JP); Yasushi Takeuchi, Tokyo-To (JP); Hirofumi Kaneko, Tokyo-To (JP)

(73) Assignee: Tokyo Electron Limited, Tokyo (JP)

( * ) Notice: Subject to any disclaimer, the term of this patent is extended or adjusted under 35 U.S.C. 154(b) by 875 days.

(21) Appl. No.: 11/665,645

(22) PCT Filed: Oct. 17, 2005

(86) PCT No.: PCT/JP2005/019039
§ 371 (c)(1),
(2), (4) Date: Oct. 22, 2008

(87) PCT Pub. No.: WO2006/043509
PCT Pub. Date: Apr. 27, 2006

(65) Prior Publication Data
US 2009/0053665 A1 Feb. 26, 2009

(30) Foreign Application Priority Data
Oct. 19, 2004 (JP) .................. 2004-303614

(51) Int. Cl.
*F27D 3/06* (2006.01)
(52) U.S. Cl. .................... 432/239; 414/940
(58) Field of Classification Search .......... 432/239, 432/241; 414/935, 937, 940, 939; 219/390, 219/405
See application file for complete search history.

(56) References Cited

U.S. PATENT DOCUMENTS
4,770,590 A * 9/1988 Hugues et al. .............. 414/172
(Continued)

FOREIGN PATENT DOCUMENTS
EP 1 134 641 A1 9/2001
(Continued)

OTHER PUBLICATIONS
PCT Notification of Transmittal of Translation of the International Preliminary Examination Report (Form PCT/IB/338) dated Jan. 2004.
(Continued)

*Primary Examiner* — Gregory A Wilson
(74) *Attorney, Agent, or Firm* — Smith, Gambrell & Russell, LLP

(57) ABSTRACT

A vertical heat treatment apparatus includes: at least one loading and unloading part 3 and 4 for loading and unloading a carrying container 2 containing a plurality of process objects W into and from said vertical heat treatment apparatus; a first storage part 5 that stores a plurality of carrying containers loaded into said vertical heat treatment apparatus via the loading and unloading part; a heat treatment furnace 7 that accommodates a holder 6 holding a plurality of process objects at multiple levels to perform a predetermined heat treatment to the process objects; and a transfer 8 part that supports thereon a carrying container for transferring process objects between the holder and the carrying container, wherein an upper loading and unloading part 3 and a lower loading and unloading part 4 are provided as said at least one loading and unloading part, and a second storage part 20 that stores a carrying container is disposed between the upper and lower loading and unloading parts. Either one of the loading and unloading parts 3, 4 is utilized as a third storage part 30 that stores a carrying container 2. The carrying container storage capacity may be increased and the throughput may be improved.

4 Claims, 3 Drawing Sheets

U.S. PATENT DOCUMENTS

| | | | | |
|---|---|---|---|---|
| 5,462,397 | A | * | 10/1995 | Iwabuchi .................... 414/217 |
| 5,562,383 | A | * | 10/1996 | Iwai et al. ................ 414/217.1 |
| 5,829,939 | A | * | 11/1998 | Iwai et al. .................... 414/411 |
| 6,318,944 | B1 | | 11/2001 | Shimeno et al. |
| 6,439,822 | B1 | * | 8/2002 | Kimura et al. .......... 414/331.04 |
| 6,540,469 | B2 | * | 4/2003 | Matsunaga et al. ...... 414/416.08 |
| 7,740,437 | B2 | * | 6/2010 | De Ridder et al. ........ 414/217.1 |
| 7,887,276 | B2 | * | 2/2011 | Natume ...................... 414/217 |
| 7,935,185 | B2 | * | 5/2011 | Miyazaki et al. ........... 118/715 |
| 2002/0197145 | A1 | * | 12/2002 | Yamamoto et al. .......... 414/806 |
| 2003/0156928 | A1 | * | 8/2003 | Sackett et al. ............... 414/217 |
| 2009/0053665 | A1 | * | 2/2009 | Haraki et al. .................... 432/1 |

FOREIGN PATENT DOCUMENTS

| | | |
|---|---|---|
| JP | 8-148503 | 6/1996 |
| JP | 9-64150 | 3/1997 |
| JP | 10-326818 | 12/1998 |
| JP | 2000-91398 | 3/2000 |
| JP | 2002-016055 | 1/2002 |
| JP | 2004-119614 | 4/2004 |
| WO | 00/37338 | 6/2000 |

OTHER PUBLICATIONS

PCT International Preliminary Report on Patentability (Form PCT/IB/373) dated Jan. 2004.
PCT Written Opinion of the International Searching Authority (Form/ISA/237) dated Apr. 2005.
Japanese Office Action issued on Sep. 9, 2008 for Japanese Application No. 2004-303614 w/ English translation.
Japanese Office Action issued on Jul. 2, 2008 for Japanese Application No. 2004-303614 w/ English translation.
Chinese Office Action issued on Aug. 1, 2008 for Chinese Application No. 200580006516.6 w/ partial English translation.
Supplementary European Search Report for Application No. EP 05 79 3489.

* cited by examiner

VERTICAL HEAT TREATMENT APPARATUS AND METHOD FOR OPERATING THE SAME

TECHNICAL FIELD

The prevent invention relates to a vertical heat treatment apparatus and a method of operating the same.

BACKGROUND ART

In manufacturing of a semiconductor device, various treatment apparatuses (semiconductor fabricating apparatuses) are employed to perform treatments, such as oxidation, diffusion, CVD (chemical vapor deposition) and annealing, to process objects such as semiconductor wafers. As one of such apparatuses, a batch-type vertical heat treatment apparatus capable of heat-treating plural wafers at one time is known.

The vertical heat treatment apparatus includes: a load port (i.e., loading and unloading part) provided at the front portion of the vertical heat treatment apparatus for loading and unloading a carrier (also called "carrying container" or "FOUP") containing plural wafers into and from the vertical heat treatment apparatus; a storage shelf that stores plural carriers loaded into the vertical heat treatment apparatus via the load port; a heat treatment furnace that accommodates a boat (i.e., holder) holding plural wafers at multiple levels to perform a predetermined heat treatment to the wafers; and a FIMS port (i.e., transfer part) that supports thereon a carrier for transferring wafers between the boat and the carrier.

A vertical heat treatment apparatus: in one example, has a load port only at the lower portion thereof; in another example, has a load port only at the upper portion thereof; in another example, has load ports at both upper and lower portions thereof (See JP2004-119614A, for example).

In a vertical heat treatment apparatus, it is desirable that the apparatus can store therein carriers as many as possible, and that the apparatus is adapted for various carrier-storing patterns, in view of shortening of treatment time and improvement of throughput. However, in conventional vertical heat treatment apparatuses, only a shelf is prepared as a space for storing carriers, and thus a limited number of carriers may be stored in the apparatus. Moreover, the load port plays only a role of loading and unloading carriers into and from the vertical heat treatment apparatus. It should be noted that it is not preferable to increase the size (or footprint) of the vertical heat treatment apparatus for the purpose of increasing the space for storing carriers.

DISCLOSURE OF THE INVENTION

The present invention has been made in view of the foregoing circumstances, and it is therefore the object of the present invention to provide a vertical heat treatment apparatus and a method of operating the same that are capable of increasing carrying container storage capacity and of improving the throughput, without increasing the footprint.

In order to achieve the objective, the present invention provides a vertical heat treatment apparatus including: at least one loading and unloading part for loading and unloading a carrying container containing a plurality of process objects into and from said vertical heat treatment apparatus; a first storage part that stores a plurality of carrying containers loaded into said vertical heat treatment apparatus via the loading and unloading part; a heat treatment furnace that accommodates a holder holding a plurality of process objects at multiple levels to perform a predetermined heat treatment to the process objects; and a transfer part that supports thereon a carrying container for transferring process objects between the holder and the carrying container, characterized in that an upper loading and unloading part and a lower loading and unloading part are provided as said at least one loading and unloading part, and that a second storage part that stores a carrying container is disposed between the upper and lower loading and unloading parts.

According to the above invention, the carrying-container storage capacity may be increased without increasing the footprint, and improvement in the throughput may be achieved.

At least part of the upper and lower loading and unloading parts may be utilized as a third storage part that stores a carrying container.

According the above feature, the carrying-container storage capacity may be further increased without increasing the footprint.

At least part of the transfer part may be utilized as a fourth storage part that stores a carrying container.

According the above feature, the carrying-container storage capacity may be further increased.

The present invention also provides a vertical heat treatment apparatus including: at least one loading and unloading part for loading and unloading a carrying container containing a plurality of process objects into and from said vertical heat treatment apparatus; a first storage part that stores a plurality of carrying containers loaded into said vertical heat treatment apparatus via the loading and unloading part; a heat treatment furnace that accommodates a holder holding a plurality of process objects at multiple levels to perform a predetermined heat treatment to the process objects; and a transfer part that supports thereon a carrying container for transferring process objects between the holder and the carrying container, characterized in that: an upper loading and unloading part and a lower loading and unloading part are provided as said at least one loading and unloading part, and that a second storage part that stores a carrying container is disposed between the upper and lower loading and unloading parts; at least part of the upper and lower loading and unloading parts is utilized as a third storage part that stores a carrying container; and said vertical heat treatment apparatus further includes a controller that uses the first storage part, the second storage part and the third storage part in different combinations thereof depending on the number of carrying containers loaded into said vertical heat treatment apparatus.

According to the above invention, the carrying-container storage capacity may be increased without increasing the footprint, and improvement in the throughput may be achieved.

The transfer part may be also utilized as a fourth storage part that stores a carrying container, and the controller may use the first storage part, the second storage part, the third storage part and the fourth storage part in different combinations thereof depending on the number of carrying containers loaded into said vertical heat treatment apparatus.

According the above feature, the carrying-container storage capacity may be further increased.

The present invention further provides a method of operating a vertical heat treatment apparatus including: at least one loading and unloading part for loading and unloading a carrying container containing a plurality of process objects into and from said vertical heat treatment apparatus; a first storage part that stores a plurality of carrying containers loaded into said vertical heat treatment apparatus via the loading and unloading part; a heat treatment furnace that accommodates a holder holding a plurality of process objects at multiple levels to perform a predetermined heat treatment to the process objects; and a transfer part that supports thereon a carrying container for transferring process objects between the holder and the carrying container, characterized in that: an upper loading and unloading part and a lower loading and unloading part are provided as said at least one loading and unloading part, and that a second storage part that stores a carrying container is disposed between the upper and lower loading and unloading parts; at least part of the upper and lower loading and unloading parts is utilized as a third storage part that stores a carrying container; and the first storage part, the second storage part and the third storage part are used in different combinations thereof depending on the number of carrying containers loaded into said vertical heat treatment apparatus.

According to the above invention, the carrying-container storage capacity may be increased without increasing the footprint, and improvement in the throughput may be achieved.

The transfer part may be also utilized as a fourth storage part that stores a carrying container, and the first storage part, the second storage part, the third storage part and the fourth storage part are may be used in different combinations thereof depending on the number of carrying containers loaded into said vertical heat treatment apparatus.

According the above feature, the carrying-container storage capacity may be further increased.

DESCRIPTION OF REFERENCE SIGNS

Figure 1:
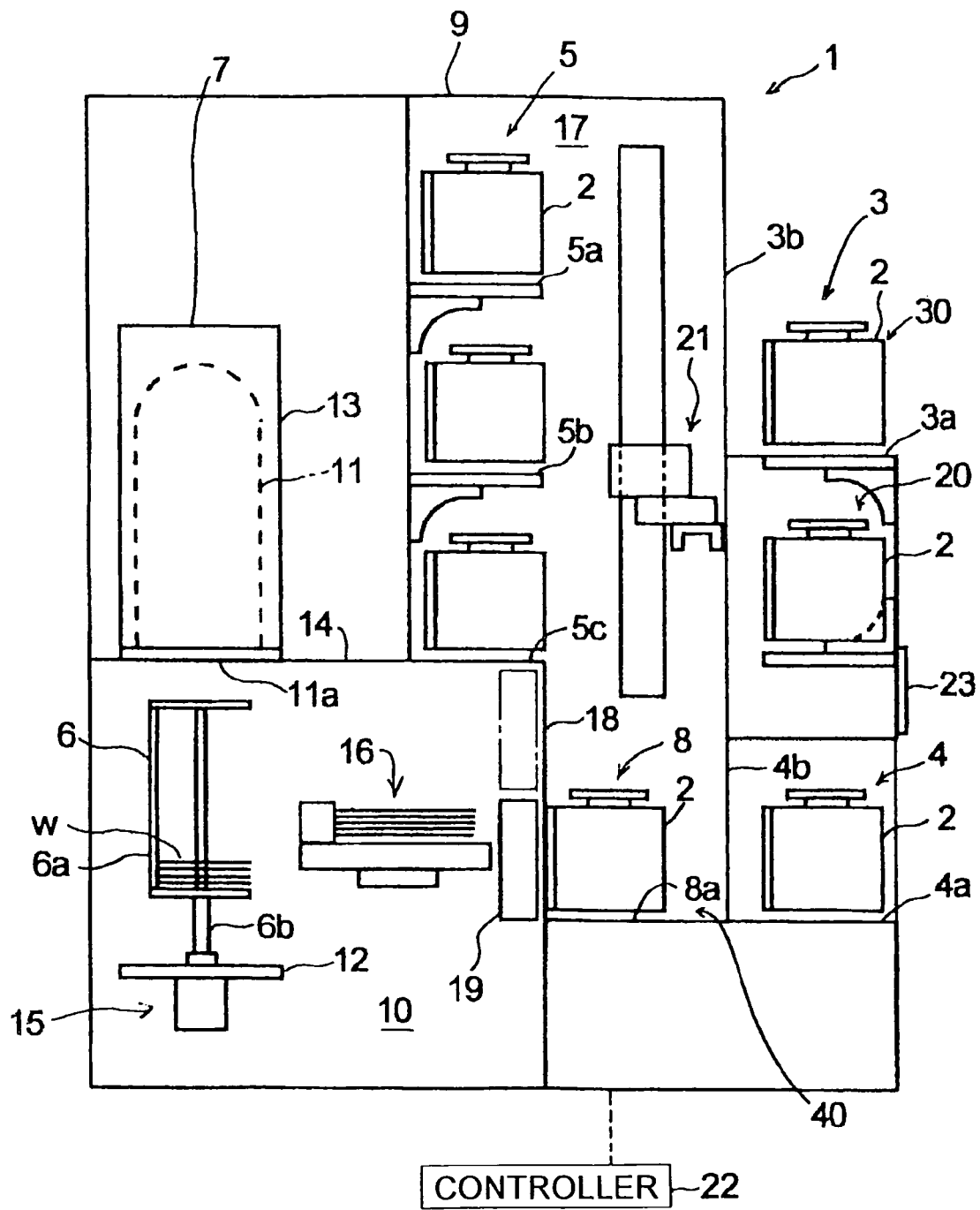
FIG. 1 is a vertical cross-sectional view schematically showing a vertical heat treatment apparatus in one embodiment of the present invention.

W: Semiconductor wafer
1: Vertical heat treatment apparatus
2: Carrier (Carrying container)
3, 4: Load port
5: Carrier stage (Loading and unloading part)
6: Boat (Holder)
7: Heat treatment furnace
8: FIMS port (Transfer part)
20: Second storage part
22: Controller
30: Third storage part
40: Fourth storage part

BEST MODE FOR CARRYING OUT THE INVENTION

Figure 2:
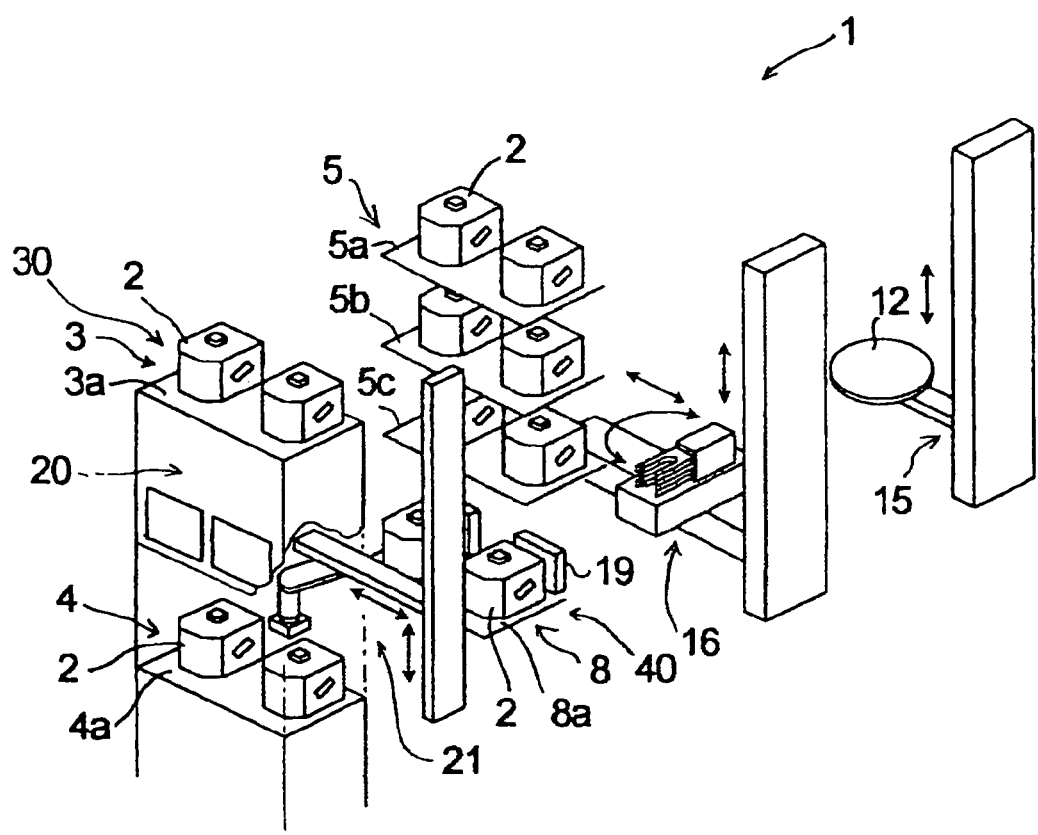
FIG. 2 is a perspective view of the vertical heat treatment apparatus shown in FIG. 1.
Figure 3:
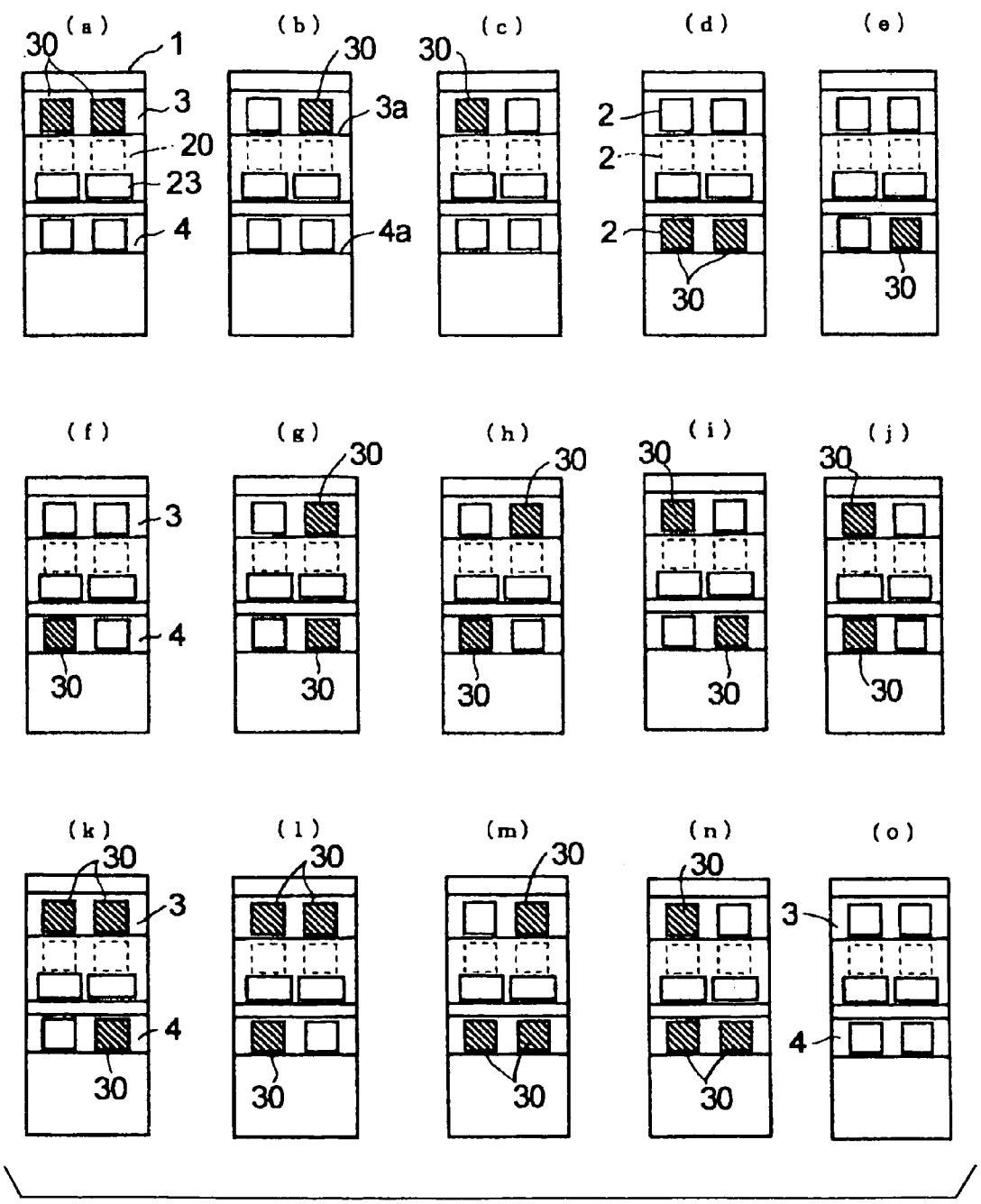
FIG. 3 is a diagram illustrating an operating method of the vertical heat treatment apparatus.

The best mode carrying out the invention will be described hereinafter in detail with reference to the attached drawings. FIG. 1 is a vertical cross-sectional view schematically showing a vertical heat treatment apparatus in one embodiment of the present invention; FIG. 2 is a perspective view of the vertical heat treatment apparatus shown in FIG. 1; and FIG. 3 is a diagram illustrating an operating method of the vertical heat treatment apparatus.

In these drawings, reference sign "1" denotes a vertical heat treatment apparatus, which includes: load ports (loading and unloading part) 3 and 4 through which carriers (carrying containers) 2 containing plural, e.g., 25, process objects such as semiconductor wafers W are loaded into the heat treatment apparatus 1 and are unloaded from the heat treatment apparatus 1; a carrier stage (storage shelf, or first buffer) 5 that accommodates and stores therein plural carriers 2 which are loaded into the vertical heat treatment apparatus 1 via the load ports 3 and 4; a heat treatment furnace 7 that accommodates a boat (holder) 6 holding plural wafers W at multiple levels to perform a predetermined heat treatment such as a CVD treatment to the wafers W; and FIMS ports (transfer part) 8, on each of which a carrier 2 is placed for transferring wafers W between the boat 6 and the carrier 2.

The carrier 2 is a sealed carrying container having a container main body capable of accommodating plural wafers at vertical intervals in horizontal attitude, and a lid, not shown, detachably attached to the front side of the container main body. The carrier 2 is transported by an OHT (overhead transport), an AGV, a RGV (rail guided vehicle), a PGV (personal guided vehicle) or a worker.

The vertical heat treatment apparatus 1 has a housing 9 serving as an enclosure thereof. The heat treatment furnace 7 is disposed at a rear upper part of the interior of the housing 9. Provided below the heat treatment furnace 7 is a loading area serving as a working area for loading the boat 6 into the heat treatment furnace 7 and for unloading the boat 6 from the heat treatment furnace 7, and also serving as a working area for transferring wafers W between the boat 6 and a carrier 2 placed on a FIMS port 8. The heat treatment furnace 7 is mainly composed of: a vertically-elongated processing vessel such as a quartz reaction tube 11 having a lower opening serving as a furnace throat 11a; a vertically-movable lid body 12 that hermetically closes the furnace throat 11a from below; and a heater 13 comprising resistance heating elements and serving as a heating mechanism that covers the circumference of the reaction tube 11 and is capable of controlling the temperature of the interior of the reaction tube 11 at a predetermined temperature, e.g., 300° C. to 1200° C.

A stainless-steel base plate 14 is disposed horizontally in the housing 9. The reaction tube 11 and the heater 13, which constitute the heat treatment furnace 7, are mounted to the base plate 14. An opening (not shown) is formed in the base plate 14. The reaction tube 11 is inserted upwardly into the opening from below the base plate 14. An outwardly-extending flange is formed at the lower end of the reaction tube 11. The flange is held by the base plate 14 via a flange holding member, thereby the reaction tube 11 is installed with the reaction tube 11 being inserted upwardly through the opening in the base plate 14 from below. Connected to the reaction tube 11 are plural gas introduction pipes for introducing a process gas and an inert gas for purging such as $N_2$ into the reaction tube 11, and an exhaust pipe provided thereon with devices, for controlling the pressure in the reaction tube 11 at a predetermined reduced pressure, such as a vacuum pump and a pressure control valve, which are not shown in the drawings.

An elevating mechanism 15 is provided in the loading area 10 to vertically move the lid body 12 so as to load the boat 6 into the heat treatment furnace 7 and unload the boat 6 from the heat treatment furnace 7. A rotary mechanism is provided at the bottom portion of the lid body 12 to rotate the boat 6. The boat 6 is made of quartz, for example. The illustrated boat 6 includes a boat main body 6a that horizontally holds many wafers W at vertical intervals, and a leg portion 6b connected to a rotary shaft of the rotary mechanism to drive the boat main body 6a for horizontal rotation. A furnace throat heating mechanism or a heat-insulating tube is provided on the lid body 12.

Provided in the loading area 10 are a shutter mechanism, not shown, that shields (heat-insulates) the furnace throat 11a which is opened upon unloading of the boat 6, and a transfer mechanism 16 that transfers wafers W between the unloaded boat 6 and a carrier 2 placed on the FIMS port 8. A transport and storage area 17, in which carriers 2 are transported and stored, is provided at a front part in the housing 9. The FIMS ports 8 are provided below the transport and storage area 17. A partition wall 18 separating the loading area 10 and the transport and storage area 17 from each other is provided in the housing 9.

Each of the FIMS ports 8 includes: a stage 8a on which a carrier 2 is placed; a fixing mechanism that secures the carrier 2 with the carrier 2 being in contact with the partition wall 18; a door mechanism 19, capable of being opened and closed, that hermetically closes, from the loading area 10 side, an opening formed in the partition wall 18 for communicating the interior of the carrier 2 and the interior and the loading area 10; and a lid opening and closing mechanism (not shown) that opens and closes the lid of the carrier 2. In the illustrated embodiment, two FIMS ports 8 are arranged on the left side and the right side; and one carrier 2 may be placed on each of the FIMS ports 8.

A carrier stage 5 is provided at a rear portion of the transport and storage area 17. In the illustrated embodiment, the carrier stage 5 has three shelves, i.e., an upper shelf 5a, an intermediate shelf 5b and a lower shelf 5c. Two carriers 2 may be placed, side by side in left-right direction, on each shelf. A carrier transfer (transfer mechanism) 21 is provided in the transport and storage area 17 to transfer a carrier 2 among the load ports 3 and 4, the carrier stage 5, the FIMS ports 8, and a second storage part 20 (described later).

The load ports 3 and 4 are arranged at an upper part and a lower part of the front side of the housing 9 (i.e., the front side of the apparatus), respectively. Each of two upper load ports 3 includes: a table 3a on which a carrier 2 is placed, and an opening 3b formed in the housing 9 to allow a carrier 2 to be loaded into the transport and storage area 17 and unloaded from the same. An overhead transport transfers a carrier 2 to and from the upper load ports. Each of two lower load ports 4 includes: a table 4a on which a carrier 2 is placed, and an opening 3b formed in the housing 9 to allow a carrier 2 to be loaded into the transport and storage area 17 and unloaded from the same. A rail guided vehicle or a worker transfers a carrier to and from the lower load ports. Two carriers 2 may be placed, side by side in left-right direction, on each of the two upper load ports 3 and the two lower load ports 4.

A second storage part (second buffer) 20 is provided between the upper and lower load ports 3, 4 to accommodate and store carriers 2. The second storage part 20 is provided by utilizing a space between the upper and lower load ports 3 and 4, and carriers 2 may be placed thereon for storage. The storage part 20 faces the transport and storage area 17. Two carriers 2 may be stored in the storage part 20 with the carriers 2 being placed side by side in left-right direction. On a front wall of the housing 9 at an area between the upper and lower load ports 3 and 4, there may be provided, an inputting, outputting and displaying unit 23, e.g., a display of a touch panel type (MMI) connected to a controller 22 that performs various control operations of the vertical heat treatment apparatus 1, such as controlling of carrier transport, controlling of wafer transfer, process-control of heat treatment.

Any one of the load ports 3 and 4 may be utilized as a third storage part 30. Depending on the number of carriers 2 loaded into (or used in) the vertical heat treatment apparatus 1, the controller 22 uses the first storage part 5 which is a carrier stage, the second storage part 20 and the third storage part 30 in appropriate combination, for storing carriers 2. In operation of the vertical heat treatment apparatus 1, in addition to the carrier stage (first buffer) 5 and the second storage part (second buffer) 20, any one or more of the upper and lower load ports 3 and 4 are utilized as the third storage part 30; and the carrier stage (first buffer) 5, the second storage part (second buffer) 20 and the third storage part (third buffer) 30 are used in appropriate combination, depending on the number of loaded carriers 2. Fifteen combinations shown in FIGS. 3(*a*) to 3(*o*) are possible when utilizing any one or more of the upper and lower load ports 3 and 4 for storing carriers 2. In the illustrated examples, carrier(s) placed on load port(s) utilized as the buffer 30 are shaded (hatching) to clarify the load port(s) utilized as the buffer.

FIG. 3 (*a*) shows an example in which the two lower load ports 4 are utilized as load ports, while the two upper load ports 3 are utilized as the buffer 30.

FIGS. 3 (*b*) and (*c*) show examples in which the two lower load ports 4 are utilized as load ports, while one of the two upper load ports 3 is utilized as the buffer 30.

FIG. 3 (*d*) shows an example in which the two upper load ports 3 are utilized as load ports, while the two lower load ports 4 are utilized as the buffer 30.

FIGS. 3 (*e*) and (*f*) show example in which the two upper load ports 3 are utilized as load ports, while one of the two lower load ports 4 are utilized as the buffer 30.

FIGS. 3 (*g*) to (*j*) show examples in which one of the two upper load ports 3 and one of the two lower load ports 4 are utilized as load ports, while the remaining two load ports are utilized as the buffer 30.

FIGS. 3 (*k*) to (*n*) show examples in which three of the four upper and lower load ports 3 and 4 are utilized as load ports, while the remaining one load port is utilized as the buffer 30.

FIG. 3 (*o*) shows an example in which all the four upper and lower load ports 3 and 4 are utilized as load ports, and thus are not utilized as the buffer.

Note that the term "store (storage)" means a carrier once placed on a storage place (e.g., a load port) is left placed on the storage place at least during a time period in which a treatment of one batch is performed in the heat treatment furnace 7.

In a case where plural (in the illustrated embodiment, two) FIMS ports 8 are provided in the vertical heat treatment apparatus 1, at least one (in the illustrated embodiment, one) of the FIMS ports 8 may be used to play its primary role, while the other FIMS port(s) 8 (in the illustrated embodiment, the other one) may be utilized as a fourth storage part (fourth buffer) 40 that temporarily stores carrier 2. In this case, depending on the number of carriers 2 loaded into the vertical heat treatment apparatus 1, the controller 22 uses the carrier stage (first buffer) 5, the second storage part (second buffer) 20, the third storage part (third buffer) 30 and the fourth storage part (fourth buffer) 40 in appropriate combination.

In the foregoing vertical heat treatment apparatus 1, since the second storage part 20 for storing carriers 2 is provided between the upper and lower load ports 3 and 4 in addition to the carrier stage 5, the carrier storage capacity can be increased without increasing the footprint, and shortening of the treatment time and improvement of the throughput can be achieved.

In the illustrated embodiment, since there are provided, in addition to the carrier stage (first buffer) 5 allowing six carriers to be placed thereon, a storage part (second buffer) 20 allowing two carriers to be placed thereon, in total eight carriers may be accommodated and stored. As the storage part 20 is provided between the upper and lower load ports 3 and 4, the carrier storage capacity may be increased by two without increasing the footprint. Moreover, if any one or more of the load ports 3 and 4 are used as a third storage part 30, the carrier storage capacity may be further increased without increasing the footprint.

In the vertical heat treatment apparatus 1, since there is provided the controller 22 that uses the carrier stage 5, the second storage part 20 and the third storage part 30 in appropriate combinations thereof depending on the number of carriers 2 loaded into the apparatus 1, the carrier storage capacity may be increased without increasing the footprint, and improvement in the throughput may be achieved.

At least one FIMS port 8 is necessary. If two FIMS ports 8 are arranged side by side in left-right direction as show in the illustrated embodiment, one of the two FIMS ports 8 may be utilized as the fourth storage part (fourth buffer) 40. In detail, one of the two FIMS ports 8 may serve as the fourth storage part 40 and the controller 22 may use the carrier stage 5, the second storage part 20, the third storage part 30 and the fourth storage part 40 in appropriate combinations thereof depending on the number of carriers 2 loaded into the apparatus 1. In this case, the carrier storage capacity may be further increased without increasing the footprint.

In addition, the carrier storage capacity may be further increased without increasing the footprint, and improvement in the throughput may be achieved, if: the second storage part 20 that stores carriers 2 is provided in the housing 9 between the upper load ports 3 and the lower load ports 4; at least one or more of the load ports 3 and 4 is utilized as the third storage part 30 that stores carriers 2; and the carrier stage 5, the second storage part 20 and the third storage part 30 are used in appropriate combinations thereof depending on the number of carriers 2 loaded into the apparatus 1.

In the examples shown in FIGS. 3 (*k*) to (*n*), since there are provided, in addition to the carrier stage (first buffer) 5 allowing six carriers to be placed thereon, the storage part (second buffer) 20 allowing two carriers to be placed thereon and three of the upper and lower load ports 3 and 4 serve as the storage part (third buffer) 30, in total eleven carriers may be accommodated and stored. As the storage part 20 is arranged between the upper load ports 3 and the lower load ports 4 and at least one of the upper load ports 3 and the lower load ports 4 is used for storage (30), the carrier storage capacity may be increased by five without increasing the footprint.

In addition, the carrier storage capacity may be further increased if one of the FIMS ports 8 serves as the fourth storage part 40, and if the first storage part 5, the second storage part 20, the third storage part 30 and the fourth storage part 40 are used for storage of the carriers in appropriate combinations thereof depending on the number of carriers 2 loaded into the apparatus 1.

Although the embodiments and the examples of the present invention has been described with reference to the drawings, the present invention is not limited to the embodiments and the examples, and design variations or the like are possible without departing from the scope of the present invention.

The invention claimed is:

1. A vertical heat treatment apparatus including:
    at least one loading and unloading part for loading and unloading a carrying container containing a plurality of process objects into and from said vertical heat treatment apparatus;
    a first storage part that stores a plurality of carrying containers loaded into said vertical heat treatment apparatus via the loading and unloading part;
    a heat treatment furnace that accommodates a holder holding a plurality of process objects at multiple levels to perform a predetermined heat treatment to the process objects; and
    a transfer part that supports thereon a carrying container for transferring process objects between the holder and the carrying container, wherein
    an upper loading and unloading part and a lower loading and unloading part are provided as said at least one loading and unloading part, and a second storage part that stores a carrying container is disposed between the upper and lower loading and unloading parts;
    at least part of the upper and lower loading and unloading parts is utilized as a third storage part that stores a carrying container; and
    said vertical heat treatment apparatus further includes a controller that uses the first storage part, the second storage part and the third storage part in different combinations thereof depending on the number of carrying containers loaded into said vertical heat treatment apparatus.

2. The vertical heat treatment apparatus according to claim 1, wherein the transfer part is also utilized as a fourth storage part that stores a carrying container, and the controller uses the first storage part, the second storage part, the third storage part and the fourth storage part in different combinations thereof depending on the number of carrying containers loaded into said vertical heat treatment apparatus.

3. A method of operating a vertical heat treatment apparatus that includes:
    at least one loading and unloading part for loading and unloading a carrying container containing a plurality of process objects into and from said vertical heat treatment apparatus;
    a first storage part that stores a plurality of carrying containers loaded into said vertical heat treatment apparatus via the loading and unloading part;
    a heat treatment furnace that accommodates a holder holding a plurality of process objects at multiple levels to perform a predetermined heat treatment to the process objects; and
    a transfer part that supports thereon a carrying container for transferring process objects between the holder and the carrying container, said method comprising:
    providing an upper loading and unloading part and a lower loading and unloading part as said at least one loading and unloading part;
    disposing a second storage part that stores a carrying container between the upper and lower loading and unloading parts;
    utilizing at least part of the upper and lower loading and unloading parts as a third storage part that stores a carrying container; and
    using the first storage part, the second storage part and the third storage part in different combinations thereof depending on the number of carrying containers loaded into said vertical heat treatment apparatus.

4. The method of operating the vertical heat treatment apparatus according to claim 3, wherein the transfer part is also utilized as a fourth storage part that stores a carrying container, and the first storage part, the second storage part, the third storage part and the fourth storage part are used in different combinations thereof depending on the number of carrying containers loaded into said vertical heat treatment apparatus.

* * * * *